United States Patent
Checa et al.

(10) Patent No.: US 11,916,525 B2
(45) Date of Patent: Feb. 27, 2024

(54) METHOD FOR AUTOMATICALLY CONTROLLING LOUDNESS OF AN AUDIO SIGNAL, AND DEVICE FOR AUTOMATICALLY CONTROLLING LOUDNESS OF AN AUDIO SIGNAL

(71) Applicant: Sennheiser electronic GmbH & Co. KG, Wedemark (DE)

(72) Inventors: Sofia Checa, Zürich (CH); Johannes Kares, Zürich (CH); Lorenz Bucher, Zürich (CH)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 0 days.

(21) Appl. No.: 17/459,678

(22) Filed: Aug. 27, 2021

(65) Prior Publication Data
US 2023/0065233 A1  Mar. 2, 2023

(51) Int. Cl.
*H03G 3/32* (2006.01)
*H04R 5/04* (2006.01)

(52) U.S. Cl.
CPC ............ *H03G 3/32* (2013.01); *H04R 5/04* (2013.01); *H04R 2430/01* (2013.01)

(58) Field of Classification Search
CPC ......... H03G 3/32; H04R 5/04; H04R 2430/01
See application file for complete search history.

(56) References Cited

U.S. PATENT DOCUMENTS

| | | | | |
|---|---|---|---|---|
| 5,434,922 | A * | 7/1995 | Miller | H03G 3/32 381/108 |
| 7,580,531 | B2 * | 8/2009 | Anderson | H03G 7/002 381/86 |
| 9,893,697 | B1 | 2/2018 | Churchwell, II et al. | |
| 2007/0092089 | A1 * | 4/2007 | Seefeldt | H03G 9/005 381/104 |
| 2007/0242837 | A1 * | 10/2007 | Glen | H04R 5/04 381/101 |
| 2010/0202631 | A1 * | 8/2010 | Short | H03G 9/025 381/104 |
| 2011/0305346 | A1 | 12/2011 | Daubigny | |
| 2011/0320210 | A1 * | 12/2011 | Vickers | H03G 9/025 704/500 |
| 2019/0131950 | A1 * | 5/2019 | Cheung | G10L 21/034 |

OTHER PUBLICATIONS

International Search Report and Written Opinion for Application No. PCT/EP2022/072823 dated Dec. 2, 2022.

* cited by examiner

*Primary Examiner* — Daniel R Sellers

(57) ABSTRACT

Embodiments of the invention provide for methods for automatically controlling loudness of an audio signal. Embodiments of the invention also provide for a device for automatically controlling loudness of an audio signal. In particular, the invention relates to controlling loudness of an audio signal to be replayed within a vehicle, such as a car.

30 Claims, 3 Drawing Sheets

METHOD FOR AUTOMATICALLY CONTROLLING LOUDNESS OF AN AUDIO SIGNAL, AND DEVICE FOR AUTOMATICALLY CONTROLLING LOUDNESS OF AN AUDIO SIGNAL

FIELD OF DISCLOSURE

The present invention relates to a method for automatically controlling loudness of an audio signal. The invention also relates to a device for automatically controlling loudness of an audio signal. In particular, the invention relates to controlling loudness of an audio signal to be replayed within a vehicle, such as a car.

BACKGROUND

Vehicles are nowadays a common environment for listening to music or other sound, for example audio books. However, moving vehicles generate speed-dependent noise that may interfere with the listening pleasure of the listener. Therefore, many cars use a very simple speed-dependent volume scaling for sound, i.e., the higher the speed, the louder the sound is played back. This is because speed is used as a proxy for in-cabin noise level. Various more sophisticated solutions are known, e.g., circuits for controlling the loudness of sound played back within a moving car. Usually such circuits adapt the gain of music to be played back, for example according to ambient noise levels detected by microphones inside the cabin.

When listening to music while driving in the car, road noise can partially mask the music, thus deteriorating the in-car listening experience. Whether or not music is masked by ambient driving noise is to some extent determined by the loudness ratio:

Loudness ratio=Music loudness/Noise loudness

Conventional solutions account for changes in the noise loudness by adjusting the music loudness in an effort to maintain a relatively constant loudness ratio. However, the loudness ratio can also vary if the music loudness itself varies. For example, a quiet section in the music may still be covered up by noise, even if a loud section is not. This issue is particularly prevalent in classical music due to its wide dynamic range. Current solutions to the in-car noise problem do not account for this problem.

SUMMARY OF THE INVENTION

The present invention is based on the recognition of the fact that in a moving vehicle, not only the speed or ambient noise level is to be considered for controlling the loudness of sound to be replayed, but also the dynamics of the sound itself. In particular, the present invention provides a speed-dependent reduction of the dynamic range of the music, wherein more compensating gain is applied to quiet sections of music than to loud ones. This results in less masking of the music by ambient noise, so that even quieter sections of music will still be heard in the presence of road noise.

In principle, the present invention in an embodiment relates to a method for automatically controlling the loudness of an audio signal to be replayed within a vehicle, wherein the loudness of an incoming audio signal is measured, an ambient noise level indication signal is received, such as e.g. a speed indication signal or a signal from one or more microphones, and a gain factor is calculated based on both the measured loudness and the noise level indication signal. For calculating the gain factor, an intermediate speed or noise level and a corresponding gain curve are defined and two different interpolations are used. One interpolation is used when the speed or noise level is at or below the intermediate level and the other is used when the speed or noise level is at or above the intermediate level. The gain factor is calculated according to a continuous function, and there are no discontinuities between the two interpolations, which has the advantage that no sudden change of the gain factor occurs as long as the speed and/or noise level varies continuously.

In another embodiment, the invention relates to a device for automatically controlling loudness of an audio signal to be replayed within a vehicle. The device comprises one or more loudness measurers adapted for measuring the loudness of an incoming audio signal over a defined period of time, an input circuit adapted for receiving a noise level indication signal, such as e.g. a speed indication signal, and a processor adapted for calculating a gain factor based on the measured loudness and the noise level indication signal.

In yet another embodiment, the present invention relates to a computer-readable storage medium having stored thereon computer-executable instructions that when executed on a computer cause the computer to perform a method as described herein.

BRIEF DESCRIPTION OF THE DRAWINGS

The description below may be better understood by referring to the following figures.

DETAILED DESCRIPTION OF EXAMPLE/PREFERRED EMBODIMENTS

Figure 1:
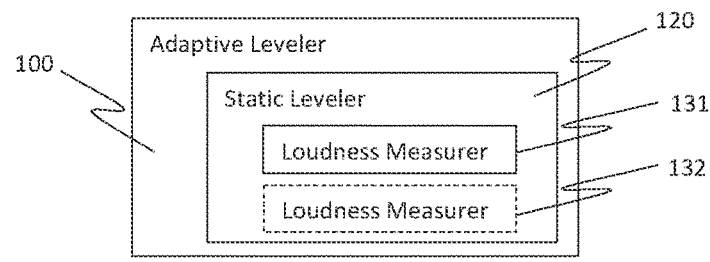
FIG. 1 shows a principle diagram of components of an Adaptive Leveler.

FIG. 1 shows a principle diagram of components of an adaptive speed-dependent leveler, according to an embodiment of the invention. A leveler is understood herein as a device that takes the loudness of a sound signal to be replayed into account for controlling gain applied to the same signal. The speed-dependent leveler 100 receives a signal indicating the current speed of a vehicle, and it uses this signal as one of at least two inputs to determine a gain factor for an input sound signal to be replayed. The speed serves as a proxy for the loudness in the cabin. The loudness of the input sound signal, also referred to as program material signal, is measured in at least one loudness measurer 131,132 and is used as a second input to determine the gain factor. In principle, a static leveler 120 calculates a gain factor based on the measured loudness of the program material, wherein it follows a gain function. The static leveler 120 becomes a dynamic or adaptive leveler in that some parameters of the static leveler vary with some properties of the outside world. In this example, the static leveler's gain function depends on the current speed of the vehicle, which usually varies less abruptly than the dynamics of the program material. In more detail, the current gain function either follows one out of three predefined gain functions or is interpolated between two out of the three predefined gain functions, in accordance with the current speed as outlined in the three cases below:

- if the current speed is zero, a first gain function is used;
- if the current speed is at a predefined threshold speed, also referred to as intermediate speed, a second gain function is used;
- if the current speed is at or above the predefined maximum speed, a third gain function is used;
- if the current speed is between zero and a predefined threshold or intermediate speed, the interpolation is between the first and the second gain function;
- if the current speed is between the threshold or intermediate speed and a defined maximum speed, the interpolation is between the second and the third gain function.

More information is provided below with respect to FIG. 3. Note that the gain calculation follows the second gain function if the current speed of the vehicle matches the threshold or intermediate speed. In one embodiment, a combination of two or more loudness measurers 131,132 is used, as explained in more detail below. More generally, it is also possible to use a noise level indication and noise level signal indicating ambient noise, instead of the speed and the signal indicating the current speed of the vehicle.

Figure 2:
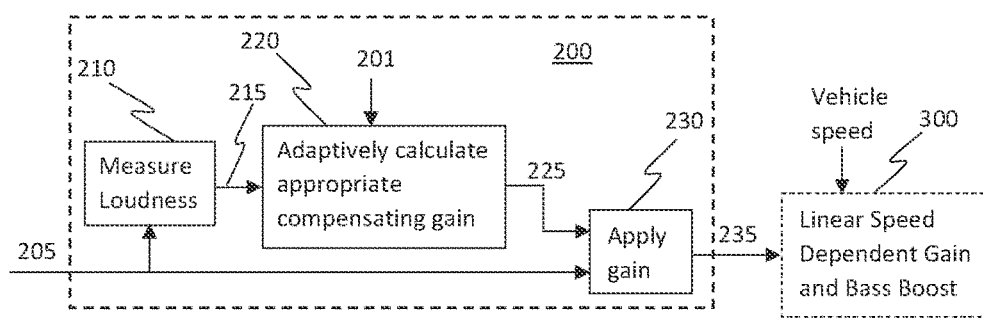
FIG. 2 shows a block diagram of an Adaptive Leveler.
Figure 5:
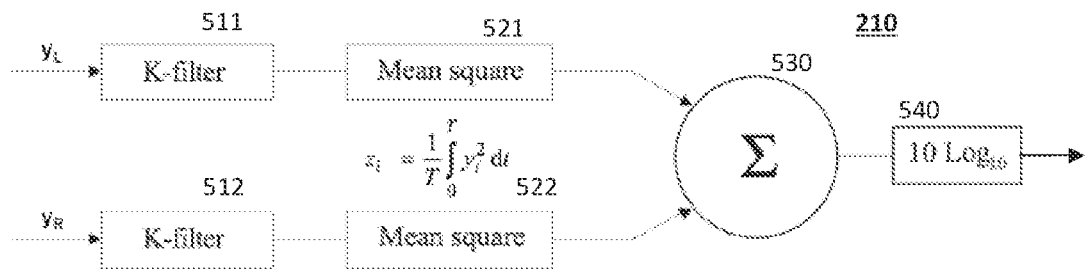
FIG. 5 shows a block diagram of a loudness measurer.

FIG. 2 shows a more detailed block diagram of an adaptive leveler. The leveler 200 comprises a loudness measurer 210 that may measure the loudness of an input audio signal 205. For example, in one embodiment the loudness may be measured in LKFS (Loudness, K-weighted, relative to Full Scale) or LUFS (Loudness Units in Full Scale). However, the loudness may be measured in any appropriate unit. For example, in one embodiment the loudness is measured using a proprietary method. More details on the loudness measuring are provided below with respect to FIGS. 5 and 6. The loudness of the input audio signal is adapted (i.e., amplified) to meet a target loudness which depends on the loudness of the ambient noise. The applied gain 225 changes over time, depending on the loudness of the input audio signal 205 and the loudness of the ambient noise. For the adaptive leveling, circuitry of a gain calculation module 220 is used. The circuitry may be software-configured. The gain calculation module 220 receives at least one value 215 representing the measured loudness of the audio signal 205 and at least one value 201 representing the loudness of ambient noise. The value 201 representing the loudness of ambient noise may be, e.g., a signal indicating the current speed of the vehicle, the rotational speed of the vehicle's engine, or a signal from one or more microphones. More specifically, the gain calculation module 220 may determine a current target loudness and a current maximum allowed gain, which are parameters of the static leveler which depend on the ambient noise level within the cabin of the vehicle. This has the advantage that the listener within the vehicle can hear the sound better, since it is sufficiently amplified to be no longer masked by ambient noise.

The gain calculation module 220, which may be implemented by one or more suitably configured processors, provides a gain value 225 to an amplifier 230, which applies the calculated gain value to the input audio signal 205 to obtain an amplified output audio signal 235. The output audio signal 235 may be provided to an amplifier or any other conventional module 300 that may optionally also perform a speed-dependent gain to the audio signal. The module 300 may also scale the gain with the noise level in the car. The module 300 and/or any subsequent module may apply a second gain factor, independent from the first gain factor that the leveler 200 applies, such that the first and second gain factors together determine the loudness of the replayed audio signal. Both gain factors are, in this embodiment, independent from the master volume which is a later gain stage that the user may control manually. In other embodiments, however, the gain factor may be coupled to the master volume. For example, it is possible that a more intense effect (i.e., more leveling and a smaller dynamic range) is applied if the user is listening at a lower volume level, while a less intense effect (i.e., less leveling and a larger dynamic range) is applied if the user is listening at a higher volume level.

Figure 3:
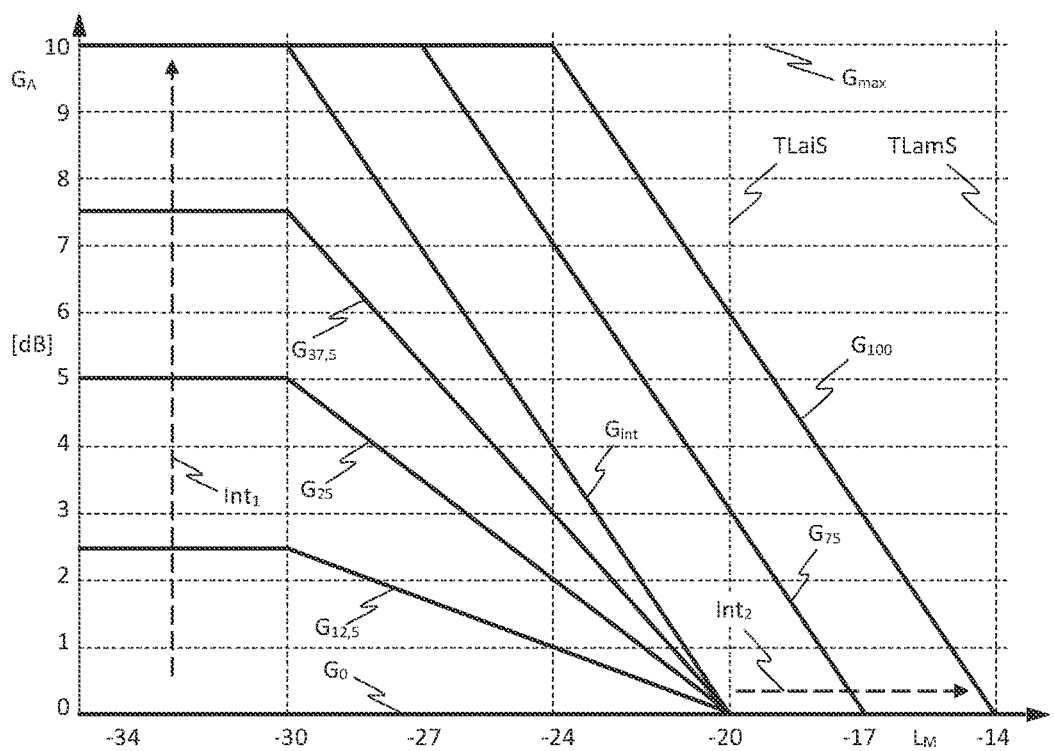
FIG. 3 shows an exemplary gain curve for a speed-dependent gain factor calculation.

FIG. 3 shows exemplary gain curves for a speed-dependent gain factor calculation, in an embodiment. Which gain curve is to be currently applied depends on the speed of the vehicle. In this way, each gain curve can be thought of as a different parametrization of a static leveler. The horizontal axis represents the measured loudness $L_M$ 215 of the input signal 205 in decibels relative to full scale (dBFS), while the vertical axis represents the gain $G_A$ to be applied 225 by the leveler 200. It is noted that all numeric values are exemplary, though they have proven to be advantageous for a pleasant sound image of music.

For very loud input signals having a measured loudness at or above a first target loudness TLaMS ("Target Loudness at Maximum Speed"), which is in this example set to −14 dBFS, no additional amplification is required, and the applied gain $G_A$ is therefore set to zero dB. Independent from the measured loudness, the applied gain $G_A$ is also set to zero dB always when the vehicle is not moving, i.e., when the speed is zero, as shown in a first gain curve $G_0$. For other cases, i.e., for input signals with a loudness below the first target loudness TLaMS and a non-zero vehicle speed, the applied gain $G_A$ depends on both the measured loudness and the speed. An interpolation may be performed, wherein the type of interpolation depends on the current speed and on its relation to a predefined or configured maximum speed and to a predefined or configured intermediate speed. The intermediate speed is also referred to as threshold speed.

If the current speed matches or exceeds the defined maximum speed, the applied gain follows a third gain curve $G_{100}$. As mentioned above, the third gain curve $G_{100}$ comprises a zero gain section when the measured loudness is above the first target loudness TLaMS. Further, the third gain curve $G_{100}$ comprises a section of a maximum allowed gain $G_{max}$ when the measured loudness is below the first target loudness TLaMS minus the maximum allowed gain $G_{max}$, i.e., TLaMS−$G_{max}$. It is noted here that this calculation can be made even though TLaMS is measured in dBFS and $G_{max}$ is measured in dB. Finally, the gain curve $G_{100}$ comprises a linear section (in logarithmic scale) for when the measured loudness is above that value and below the first target loudness TLaMS. If the measured loudness is in this range, it will be amplified by the applied gain $G_A$ to reach the first target loudness TLaMS.

It is noted here that the defined maximum speed for the gain calculation is usually not the maximum speed that the car may reach, but may be considerably lower, such as e.g. 80 km/h or 100 km/h. It is the speed above which no further changes to parameters of the algorithm are made. The defined maximum speed may be a speed where the road noise is considerable, but a relaxed driving is still possible, so that the driver and passengers are able to enjoy the sound. In an embodiment, this may depend on a type of road, which may be determined by a parameter obtained from a navigation system, for example. That is, if the navigation system detects that the car is on a highway or other high-speed lane, the parameters (or at least the defined maximum speed for gain calculation) may be different (e. g. higher) than in a case where the car is on a small and winding road.

If the current speed matches the configured intermediate speed or threshold speed, the applied gain follows a second gain curve $G_{int}$. In an embodiment, the intermediate speed is expressed relative to (e.g., as a fraction of) the defined maximum speed. In the example that is shown in FIG. 3, the intermediate speed is 50% of the maximum speed. Generally, it may be within any range of the maximum speed, e.g., 40%-60%. The intermediate speed is configurable and in principle, also a different range may be suitable.

The second gain curve $G_{int}$ is similar to the third gain curve $G_{100}$, except that it is shifted towards a lower measured loudness by an amount of TLaMS-TLaIS. That is, the gain curve $G_{int}$ comprises a zero gain section when the measured loudness is above a second target loudness TLaIS ("Target Loudness at Intermediate Speed"). Further, the second gain curve $G_{int}$ comprises a section of a maximum allowed gain $G_{max}$ when the measured loudness is below the second target loudness TLaIS minus the maximum allowed gain $G_{max}$, i.e., TLaIS-$G_{max}$. Lastly, the second gain curve $G_{int}$ comprises a linear section (in logarithmic scale) for when the measured loudness is above that value and below the second target loudness TLaIS. If the measured loudness is in this range, it will be amplified by the applied gain $G_A$ to reach the first target loudness TLaIS. In this example, the second target loudness TLaIS is −20 dBFS, the maximum allowed gain is 10 dB, and thus the section of the maximum allowed gain $G_{max}$ is valid for a measured loudness below and up to −30 dBFS, according to the second gain curve $G_{int}$. In between the section of maximum allowed gain $G_{max}$ and a gain of zero at the second target loudness TLaIS, the applied gain $G_A$ corresponds to a difference between the current measured loudness and the second target loudness TLaIS. The gain curve $G_{int}$ in this range is substantially linear (in decibels, which is a logarithmic measure). That is, if the measured loudness is in this range, the input signal will be amplified by the applied gain $G_A$ to reach the second target loudness TLaIS.

The intermediate speed or threshold speed is a threshold between two regions of parameter space. Below the intermediate speed, a first type of interpolation $Int_1$ is used, in which linear changes in speed result in linear changes to the gain factor. Above the intermediate speed, a second type of interpolation $Int_2$ is used, in which linear changes in speed result in linear changes of the target loudness. Both lead to changes in the applied gain $G_A$.

If the speed is above the intermediate speed and below the maximum speed and the measured loudness of the input audio signal is within a certain range, the aforementioned second type of interpolation $Int_2$ is used. With the second type of interpolation, a gain curve is obtained that has the same shape as the second gain curve $G_{int}$ and the third gain curve $G_{100}$ but is shifted in between them (in the diagram, in horizontal direction). In particular, the obtained gain curve uses the same maximum allowed gain $G_{max}$ as the second and third gain curves $G_{int}$, $G_{100}$, but a different target loudness TLaCS ("Target Loudness at a Current Speed") that is interpolated between the first target loudness TLaMS and the second target loudness TLaIS. The second type of interpolation $Int_2$ for the target loudness at current speed TLaCS may be done, e. g., according to $$\text{TLaCS}=\text{TLaIS}+(\text{TLaMS}-\text{TLaIS})*((S_C-S_{int})/(S_{max}-S_{int})) \qquad (1)$$

with $S_C$, $S_{int}$, $S_{max}$ being the current speed, the configured intermediate speed and the configured maximum speed respectively. If the measured loudness $L_M$ of the input audio signal is in the range between TLaCS and TLaCS-$G_{max}$ the applied gain is the difference between the measured loudness and the target loudness at the current speed TLaCS, i.e., $G_A$=TLaCS-$L_M$ where TLaCS depends on the current speed $S_C$ according to the second type of interpolation $Int_2$. Thus, the leveler will in this case output a sound level corresponding to the target loudness at current speed TLaCS. If the measured loudness $L_M$ of the input audio signal is below TLaCS-$G_{max}$, then the applied gain $G_A$ is $G_{max}$.

If the speed is below the intermediate speed, the aforementioned first type of interpolation $Int_1$ is used (at least if the measured loudness is below the second target loudness TLaIS). With the first type of interpolation $Int_1$, a gain curve is obtained that has a similar shape as the second gain curve $G_{int}$ but is scaled (in the diagram, in vertical direction). That is, less gain is applied to input signals. In one embodiment, a gain scaling factor is applied to the second gain curve $G_{int}$, wherein linear changes in the speed result in linear changes to the gain scaling factor. To illustrate, three gain curves $G_{12.5}$, $G_{25}$, $G_{37.5}$ for current speeds of 12.5%, 25% and 37.5% of the defined maximum speed respectively are depicted in FIG. 3. The gain curve at any current speed below the intermediate speed uses a speed-dependent maximum allowed gain $G_{max,S}$ that is scaled according to the gain scaling factor (that is, it is interpolated between the maximum allowed gain $G_{max}$ and zero) and therefore lies between the maximum gain $G_{max}$ and zero. Examples are provided below. The first type of interpolation $Int_1$ may be used for obtaining the speed-dependent maximum gain (for a current speed $S_C$ below the intermediate speed $S_{int}$, i.e., $S_C<S_{int}$) according to $$G_{max,S}=G_{max}*S_C/S_{int} \qquad (2)$$

For example, the maximum possible gain at a speed of 25% $G_{max,25}$ (of the predefined maximum speed) is 5 dB in FIG. 3 (or 50% of $G_{max}$), while $G_{max,37.5}$ at a speed of 37.5% is 7.5 dB. The speed-dependent maximum possible gain $G_{max,S}$ is applied in the same range of measured loudness as the maximum possible gain $G_{max}$ is applied by the second gain curve $G_{int}$, i.e., when the measured loudness is below TLaIS-$G_{max}$. Consequently, for a given current speed below the intermediate speed, the gain will be between $G_{max,S}$ and 0.

In the example depicted in FIG. 3, when the speed equals the intermediate speed and the measured loudness $L_M$ is e.g. −30 dBFS, the target loudness is −20 dBFS and thus a gain of 10 dB is applied, according to the second gain curve $G_{int}$. However, for a lower speed of e.g. 12.5% of the predefined or configured maximum speed and the same measured loudness of −30 dBFS, the target loudness is lower, namely only −27.5 dBFS, due to the lower speed, and thus the gain factor will be 0.25 and a gain of only 2.5 dB is applied (according to the corresponding gain curve $G_{12.5}$). As the measured loudness $L_M$ at this lower speed increases above −30 dBFS, the corresponding applied gain is continuously decreased until it reaches zero when the measured loudness $L_M$ equals the second target loudness TLaIS (i.e., at $L_M$=TLaIS).

Figure 6:
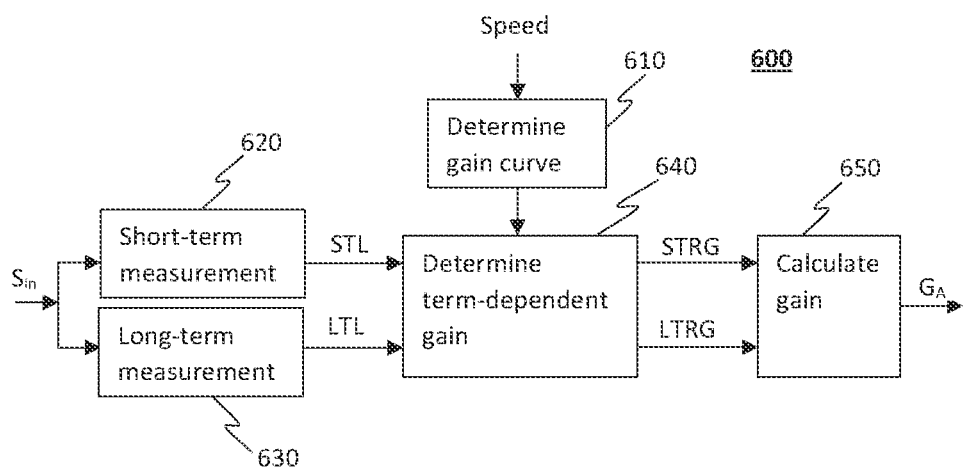
FIG. 6 shows a block diagram of the gain calculation.

Further information about how the current gain scaling factor and current target loudness are used in an embodiment with two loudness measurers is provided in the description of FIG. 6 below.

Advantageously, any or all of the intermediate speed, the maximum speed, the first target loudness TLaMS, the second target loudness TLaIS and the maximum allowed gain $G_{max}$ can be used as parameters for tuning the leveler.

Figure 4:
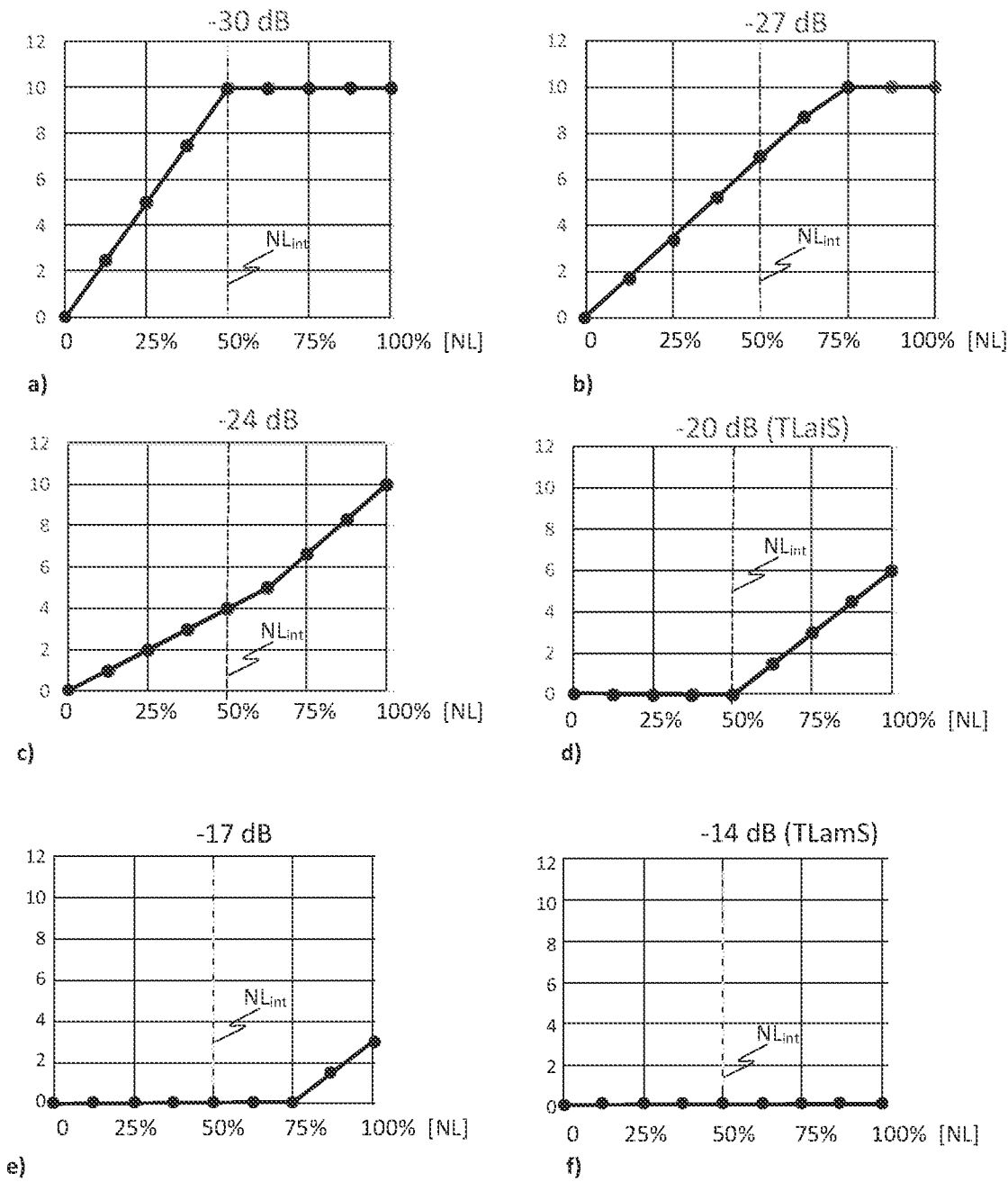
FIG. 4 shows an exemplary gain curves for a gain factor to be applied for various levels of measured loudness, each depending on an ambient noise-level.

FIG. 4 shows the applied gain factors of the example in FIG. 3, but looking from a different perspective. The single diagrams of FIG. 4 show exemplary gain curves for the gain factor to be applied at various noise levels NL, or speeds respectively, wherein it depends on the measured loudness which of the diagrams is used. In other words, the diagrams show how the gain is adapted to different noise levels NL (or speeds), each for a given measured loudness of the input signal. The noise level NL is between zero and 100% of a predefined maximum. It may correspond to e.g. the speed of a vehicle, but it may also be influenced by other physical quantities. Again, the predefined maximum of 100% need not necessarily correspond to a physical maximum value; higher values that may occur will be handled like the predefined maximum. The gain curve shown in FIG. 4 a) is used for input signals having a measured loudness of −30 dBFS. In this case, the applied gain is increased linearly for noise levels between 0% and the defined intermediate value $NL_{int}$ (here, 50%), and remains at a defined maximum of 10 dB for higher noise levels. The gain curve shown in FIG. 4 b) is used for slightly louder input signals having a measured loudness of −27 dBFS. In this case, the applied gain is increased linearly up to the defined maximum of 10 dB for noise levels between 0% and 75%, remaining at the defined maximum for higher noise levels. The points on FIG. 4b) correspond to the places where the curves of FIG. 3 cut through a vertical line at −27 dB. The gain curve shown in FIG. 4 c) is used for even louder input signals having a measured loudness of −24 dBFS. Here, the applied gain is increased linearly at a lower rate as long as the noise level is below the intermediate value $NL_{int}$ (here, 50%), and at a higher rate otherwise. The points on FIG. 4c) correspond to the places where the curves of FIG. 3 cut through a vertical line at −24 dB.

If the measured loudness of the input signal reaches the second target loudness TLaIS, which is −20 dB in this example, the applied gain remains zero for any noise-level below the defined intermediate value $NL_{int}$, as shown in FIG. 4 d). This corresponds to the fact that in FIG. 3 the gain curve for any speed at or below the intermediate speed $G_{int}$ is zero at the second target loudness TLaIS. Only for higher noise-levels, the applied gain is increased. Similarly, FIG. 4 e) shows the gain applied to input signals having a measured loudness of −17 dBFS, i.e., between the first target loudness TLaMS and the second target loudness TLaIS. In this case, the input signal is only amplified if the noise level is high, in this example over 75% of the maximum defined noise level. Similarly, for even louder input signals than −17 dBFS, the applied gain factor remains zero even for higher noise levels and then is increased linearly. When the measured loudness reaches the first target loudness TLaMS, as in FIG. 4 f), the applied gain remains zero, independent from the noise level.

In the following, more details are provided on how the loudness measurers 131,132 may measure the loudness of the input signal. Note that the loudness measurer does not alter the input audio signal in any way. In an embodiment shown in FIG. 5, the power for each channel $y_L$, $y_R$ of the input signal is determined by a mean square calculation 521,522 and then summed 530, similar to a known method of measuring loudness according to the ITU_BS1770-3 or EBU R128 broadcast standards. Optionally, K-weighting using K-filters 511,512 may be applied before the mean square summation. The total power is converted 540 to a logarithmic format in order to obtain a loudness value.

Conventional loudness measurement according to ITU_BS1770-3 or EBU R128 standards uses gating, with a first gating stage for silence exclusion and a second gating stage for prioritizing foreground sound over background sound. Overlapping gating blocks with a length of 400 ms are conventionally used to determine which parts of the incoming audio signal contribute to the reported loudness measurement.

The present invention in an embodiment differs from the conventional method at least in that it does not use these gating blocks or stages. As a result, foreground and background sounds are given equal priority. The benefit of omitting this gating is illustrated with e.g. music which contains both direct sounds and diffuse reflections. For example, a recording of a string quartet in a concert hall contains both direct sounds and diffuse reflections. The diffuse reflections tend to be quieter, but they are crucial to creating a compelling sense of space and immersion for the listener, e.g., inside a car. With the conventional method of measuring loudness, the diffuse reflections might be excluded from the measurement. Since only audio blocks with higher loudness are considered, the conventional measurement can result in a measured loudness that is too high. As a result, any compensating gain will be slightly less, and these diffuse elements might still be lost under the noise floor. Using the above-described improved solution, these quieter elements are included in the loudness measurement, resulting in a lower measured loudness and thus a higher compensating gain.

In the present invention, silence is still excluded, but on the audio block level rather than on the gating block level. A given audio block is only allowed to contribute to the loudness measurement if it does not contain silence, i.e., if its loudness is above a predefined threshold referred to as "Loudness of Silence" (LoS). This threshold may be set at e.g. −70 dBFS. An audio block may comprise e.g. 512 samples. Generally, the block size does not matter. If the loudness of the audio block is above the LoS, this loudness is pushed to a queue that helps keep track of loudness over time, and an old loudness value is popped from the queue and discarded. If the loudness of this block is not above the LoS, it is immediately discarded, and the queue is left in its previous state, meaning that a previous loudness measurement is used until the signal again rises over the LoS. Thus, the loudness measurement is based on a constant number of audio blocks, each of which having a measured loudness between the LoS and 0 dBFS.

Different approaches for choosing a compensating gain to achieve leveling may be used. In one embodiment, the loudness is measured over a constant period of time. In another embodiment however, the measured loudness may be obtained over two different predefined time intervals simultaneously. FIG. 6 shows a block diagram of an exemplary gain calculation module 600 that is term-dependent, i.e. it measures a Long Term Loudness LTL and a Short Term Loudness STL simultaneously. Each time an audio block of the input signal Sin is processed, the Long Term Measurer (LTM) 630 reports the long term loudness LTL over the previous long term measurement interval, and the Short Term Measurer (STM) 620 reports the short term loudness STL over the previous short term measurement interval. A gain curve determining module 610 determines a current gain curve according to the current speed, as described above. The audio input signal Sin is provided to different loudness measurement blocks 620, 630 in which the Long Term Loudness LTL and the Short Term Loudness STL are determined. The LTL and STL as well as the determined current gain curve are provided to a gain determining module 640.

The Long Term Requested Gain LTRG is calculated by first finding the difference between the target loudness and the long term loudness LTL and then clamping this difference to the maximum allowed gain $G_{max}$. Likewise, the Short Term Requested Gain STRG is calculated by finding the difference between the target loudness and the short term loudness STL and clamping this difference to the maximum allowed gain $G_{max}$. The same target loudness is used for both calculations, and it is obtained according to the noise level or speed of the car as described above, e.g., with respect to FIG. 3. Then, the requested gains LTRG and STRG may be compared in a gain calculation module 650, which also calculates the gain to be applied. Herein, a predefined (i.e., configurable) Long Term Influence Extension (LTIE) can be used, which is also given in decibels dB. The LTIE allows the LTL to play a role in determining the applied gain $G_A$ even when the STRG is less than the LTRG. This may occur in cases where, e.g., music has been generally quiet (and therefore has a low LTL and high LTRG) but has a short period that is louder than the rest (resulting in a higher STL and lower STRG). The gain $G_A$ to be applied may be obtained by the gain calculation module 650 as follows:

If (LTRG<STRG), then LTRG is applied (so that $G_A$=LTRG).

If (STRG<LTRG), two cases may occur:
  If (STRG<LTRG−LTIE), then STRG is applied (so that $G_A$=STRG).
  If (LTRG−LTIE<STRG<LTRG), then an interpolation is performed for $G_A$.

The interpolation may provide a gain level between STRG and LTRG, e.g., according to $G_A$=LTRG−(LTRG−STRG)$^2$/LTIE. With this interpolation, a larger difference between LTRG and STRG results in an applied gain closer to STRG (i.e., smaller applied gain), while a smaller difference results in an applied gain closer to LTRG (i.e., larger applied gain). The interpolation for the case LTRG−LTIE<STRG<LTRG has no discontinuities: as the difference LTRG-STRG approaches zero, the applied gain $G_A$ approaches LTRG, and as the difference approaches LTIE, the applied gain $G_A$ approaches STRG. The LTIE can be used to find a good balance between reducing pumpiness and reducing overshoots. A high LTIE value (e.g., above 6 dB) makes the music less pumpy at the risk of introducing overshoots, while a low or zero LTIE value reduces overshoots but may result in some pumpiness.

In every case, the $G_A$ generated from the above comparisons is as a last step scaled by the gain scaling factor according to the noise level or speed of the car as described above e.g., with respect to FIG. 3.

As an example, the long term measurement interval may be in the range of 10-20 seconds and the short term measurement interval in the range of 1-4 seconds. If the measured loudness over either time interval sinks below a predefined silence threshold ST, the applied gain is frozen, i.e., retains the previous value (as in the most left-hand portion of FIG. 3), and only becomes unfrozen once both loudness values rise above the silence threshold again. Note that the silence threshold ST configured in the leveler is separate from the above-mentioned Loudness of Silence LoS. However, the silence threshold cannot be set below the Loudness of Silence.

In an alternative embodiment, the algorithm may be configured to ignore the short term loudness STL measurement and the loudness is only measured over the configured long term interval. Then, short term loudness STL and long term influence extension LTIE are not used, and the silence threshold is only compared to the long term loudness LTL.

While various different embodiments have been described, it is clear that combinations of features of different embodiments may be possible, even if not expressly mentioned herein. Such combinations are considered to be within the scope of the present invention.

The invention claimed is:

1. A method for automatically controlling loudness of an audio signal to be replayed within a vehicle, the method comprising
   an automatic loudness measurer measuring a loudness of an incoming audio signal that comprises a sequence of digital audio blocks;
   receiving a noise level indication signal indicating a noise level within the vehicle;
   a processor calculating a gain factor based on the measured loudness of the incoming audio signal and the noise level indication signal either using a first type of interpolation or a second type of interpolation, wherein
   if the measured loudness is equal to or above a predefined first target loudness (TLamS), the gain factor is zero dB;
   and otherwise, if the noise level indication signal indicates a noise level equal to or above a predefined intermediate noise level, the second type of interpolation is used, wherein the gain factor is a difference between the measured loudness and a current target loudness, limited to a maximum gain, wherein the maximum gain is a defined absolute maximum gain, and the current target loudness is linearly interpolated, according to the noise level indication signal, between a predefined second target loudness (TLaiS) for the noise level being equal to said intermediate noise level and the predefined first target loudness (TLamS) for the noise level being equal to a predefined maximum noise level;
   and otherwise, if the noise level indication signal indicates a noise level below the intermediate noise level, the first type of interpolation is used, wherein the gain is linearly interpolated, according to the noise level, between the gain as defined for the intermediate noise level and zero; and
   applying the gain factor to the audio signal to be replayed.

2. The method of claim 1, wherein the noise level indication is obtained from a signal indicating the speed of the vehicle.

3. The method of claim 1, wherein the noise level indication is obtained from one or more microphones within the vehicle.

4. The method of claim 1, wherein the loudness measurement is based on a constant number of audio blocks having a loudness above a silence threshold, wherein an audio block having a loudness below the silence threshold does not change an internal state of the loudness measurer, and wherein the loudness measurer maintains its latest loudness measurement value until the loudness of an incoming audio block is above the silence threshold.

5. The method of claim 1, wherein the calculated gain factor is a first gain factor and wherein the first gain factor is added to a second gain factor, the first and second gain factors together determining the loudness of the audio signal to be replayed.

6. The method of claim 1, wherein the gain factor is independent from a user-controllable volume.

7. The method of claim 1, wherein the gain factor is coupled to a user-controllable volume.

8. A computer-readable non-transitory storage medium having stored thereon computer-executable instructions that when executed on a computer cause the computer to perform a method of claim 1.

9. The method of claim 1, further comprising:
obtaining the measured loudness of the incoming audio signal over two different predefined time intervals for obtaining a long term loudness and a short term loudness;
calculating a long term requested gain from the long term loudness and calculating a short term requested gain from the short term loudness;
applying the long term requested gain as gain factor, if the long term requested gain is less than the short term requested gain;
applying the short term requested gain as gain factor, if the short term requested gain is less than the long term requested gain minus a predefined long term influence extension; and
applying an interpolation between the short term requested gain and the long term requested gain as gain factor otherwise.

10. A method for automatically controlling loudness of an audio signal to be replayed within a vehicle, the method comprising
an automatic loudness measurer measuring the loudness of an incoming audio signal that comprises a sequence of digital audio blocks, wherein digital audio blocks having a loudness level below a silence threshold are detected and skipped in the loudness measuring, and wherein the measuring is based on digital audio blocks which have a loudness above the silence threshold;
receiving a speed indication signal indicating a speed at which the vehicle moves;
a processor calculating a gain factor based on the measured loudness and the speed indication signal either using a first type of interpolation or a second type of interpolation, wherein
if the measured loudness is equal to or above a predefined first target loudness (TLamS), the gain factor is zero dB;
otherwise, if the speed indication signal indicates a speed equal to or above a defined intermediate speed, the second type of interpolation is used, wherein the gain factor is a difference between the measured loudness and a current target loudness, limited to a maximum gain, wherein the maximum gain is a defined absolute maximum gain, and the current target loudness is linearly interpolated, according to the speed, between a predefined second target loudness (TLaiS) for the speed being equal to said intermediate speed and the predefined first target loudness (TLamS) for the speed being equal to a defined maximum speed;
and otherwise, if the speed indication signal indicates a speed below the defined intermediate speed, the first type of interpolation is used, wherein the maximum gain is linearly interpolated, according to the speed, between the absolute maximum gain and zero, wherein a current maximum gain is obtained, and the gain is either equal to the current maximum gain if the measured loudness is below said second target loudness (TLaiS) reduced by the absolute maximum gain, or the gain is obtained by linearly interpolating, according to the measured loudness, between the current maximum gain and zero; and
applying the gain factor to the audio signal to be replayed.

11. The method of claim 10, wherein the loudness measuring is based on a constant number of audio blocks having a loudness above the silence threshold.

12. The method of claim 10, wherein the calculated gain factor is a first gain factor and wherein the first gain factor is added to a second gain factor, the first and second gain factors together determining the loudness of the audio signal to be replayed.

13. The method of claim 10, wherein the gain factor is independent from a user-controllable volume.

14. The method of claim 10, wherein the gain factor is coupled to a user-controllable volume.

15. A computer-readable non-transitory storage medium having stored thereon computer-executable instructions that when executed on a computer cause the computer to perform a method of claim 10.

16. The method of claim 10, further comprising:
obtaining the measured loudness of the incoming audio signal over two different predefined time intervals for obtaining a long term loudness and a short term loudness;
calculating a long term requested gain from the long term loudness and calculating a short term requested gain from the short term loudness;
applying the long term requested gain as gain factor, if the long term requested gain is less than the short term requested gain;
applying the short term requested gain as gain factor, if the short term requested gain is less than the long term requested gain minus a predefined long term influence extension; and
applying an interpolation between the short term requested gain and the long term requested gain as gain factor otherwise.

17. A device for automatically controlling loudness of an audio signal to be replayed within a vehicle, the device comprising
an automatic loudness measurer adapted for measuring a loudness of an incoming audio signal that comprises a sequence of digital audio blocks;
an input circuit adapted for receiving a noise level indication signal indicating a noise level within the vehicle;
at least one processor adapted for calculating a gain factor based on the measured loudness and the noise level indication signal either using a first type of interpolation or a second type of interpolation, wherein
if the measured loudness is equal to or above a predefined first target loudness (TLamS), the gain factor is zero dB;
and otherwise, if the noise level indication signal indicates a noise level equal to or above a predefined intermediate noise level, the second type of interpolation is used, wherein the gain factor is a difference between the measured loudness and a current target loudness, limited to a maximum gain, wherein the maximum gain is a defined absolute maximum gain, and the current target loudness is linearly interpolated, according to the noise level indication signal, between a predefined second target loudness (TLaiS) for the noise level being equal to said intermediate noise level and the predefined first target loudness (TLamS) for the noise level being equal to a predefined maximum noise level;
and otherwise, if the noise level indication signal indicates a noise level below the intermediate noise level, the first type of interpolation is used, wherein the gain is linearly interpolated, according to the noise level, between the gain as defined for the intermediate noise level and zero; and an amplifier adapted for applying the gain factor to the audio signal to be replayed.

18. The device of claim 17, wherein the noise level indication is obtained from a signal indicating the speed of the vehicle.

19. The device of claim 17, wherein the noise level indication is obtained from one or more microphones within the vehicle.

20. The device of claim 17, wherein the loudness measurement is based on a constant number of audio blocks having a loudness above a silence threshold, wherein an audio block having a loudness below the silence threshold does not change an internal state of the loudness measurer, and wherein the loudness measurer maintains its latest loudness measurement value until the loudness of an incoming audio block is above the silence threshold.

21. The device of claim 17, wherein the calculated gain factor is a first gain factor and wherein the first gain factor is added to a second gain factor, the first and second gain factors together determining the loudness of the audio signal to be replayed.

22. The device of claim 17, wherein the gain factor is independent from a user-controllable volume.

23. The device of claim 17, wherein the gain factor is coupled to a user-controllable volume.

24. The device of claim 17, wherein
the automatic loudness measurer is further adapted for obtaining the measured loudness of the incoming audio signal over two different predefined time intervals for obtaining a long term loudness and a short term loudness;
wherein the at least one processor is further adapted for calculating a long term requested gain from the long term loudness and calculating a short term requested gain from the short term loudness;
wherein the amplifier is adapted for applying the long term requested gain as gain factor, if the long term requested gain is less than the short term requested gain, and for applying the short term requested gain as gain factor, if the short term requested gain is less than the long term requested gain minus a predefined long term influence extension, and for applying an interpolation between the short term requested gain and the long term requested gain as gain factor otherwise.

25. A device for automatically controlling loudness of an audio signal to be replayed within a vehicle, the device comprising
an automatic loudness measurer adapted for measuring the loudness of an incoming audio signal that comprises a sequence of digital audio blocks, wherein digital audio blocks having a loudness level below a silence threshold are detected and skipped in the loudness measuring, and wherein the measuring is based on the digital audio blocks having a loudness above the silence threshold;
an input circuit adapted for receiving a speed indication signal indicating a speed at which the vehicle moves;
at least one processor adapted for calculating a gain factor based on the measured loudness and the speed indication signal either using a first type of interpolation or a second type of interpolation, wherein
if the measured loudness is equal to or above a predefined first target loudness (TLamS), the gain factor is zero dB;
otherwise, if the speed indication signal indicates a speed equal to or above a defined intermediate speed, the second type of interpolation is used, wherein the gain factor is a difference between the measured loudness and a current target loudness, limited to a maximum gain, wherein the maximum gain is a defined absolute maximum gain, and the current target loudness is linearly interpolated, according to the speed, between a predefined second target loudness (TLaiS) for the speed being equal to said intermediate speed and the predefined first target loudness (TLamS) for the speed being equal to a defined maximum speed;
and otherwise, if the speed indication signal indicates a speed below the defined intermediate speed, the first type of interpolation is used, wherein the maximum gain is linearly interpolated, according to the speed, between the absolute maximum gain and zero, wherein a current maximum gain is obtained, and the gain is either equal to the current maximum gain if the measured loudness is below said second target loudness (TLaiS) reduced by the absolute maximum gain, or the gain is obtained by linearly interpolating, according to the measured loudness, between the current maximum gain and zero; and
an amplifier adapted for applying the gain factor to the audio signal to be replayed.

26. The device of claim 25, wherein the loudness measuring is based on a constant number of audio blocks having a loudness above the silence threshold.

27. The device of claim 25, wherein the calculated gain factor is a first gain factor and wherein the first gain factor is added to a second gain factor, the first and second gain factors together determining the loudness of the audio signal to be replayed.

28. The device of claim 25, wherein the gain factor is independent from a user-controllable volume.

29. The device of claim 25, wherein the gain factor is coupled to a user-controllable volume.

30. The device of claim 25, wherein
the automatic loudness measurer is further adapted for obtaining the measured loudness of the incoming audio signal over two different predefined time intervals for obtaining a long term loudness and a short term loudness;
wherein the at least one processor is further adapted for calculating a long term requested gain from the long term loudness and calculating a short term requested gain from the short term loudness;
wherein the amplifier is adapted for applying the long term requested gain as gain factor, if the long term requested gain is less than the short term requested gain, and for applying the short term requested gain as gain factor, if the short term requested gain is less than the long term requested gain minus a predefined long term influence extension, and for applying an interpolation between the short term requested gain and the long term requested gain as gain factor otherwise.

* * * * *